United States Patent
Chen et al.

(10) Patent No.: US 6,239,011 B1
(45) Date of Patent: *May 29, 2001

(54) METHOD OF SELF-ALIGNED CONTACT HOLE ETCHING BY FLUORINE-CONTAINING DISCHARGES

(75) Inventors: Bi-Ling Chen; Erik S. Jeng, both of Taipei (TW)

(73) Assignee: Vanguard International Semiconductor Corporation, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,557

(22) Filed: Jun. 3, 1998

(51) Int. Cl.[7] .......................... H01L 21/306; H01L 21/28
(52) U.S. Cl. .......................... 438/595; 438/238; 438/256; 438/397; 438/399; 438/697; 438/723; 438/724
(58) Field of Search ..................... 438/667, 596, 438/693, 709, 714, 724, 706, 689, 595, 710, 238, 397, 399, 692, 697, 723, 256

(56) References Cited

U.S. PATENT DOCUMENTS

| | | | |
|---|---|---|---|
| 4,376,672 | * 3/1983 | Wang et al. | 438/689 |
| 4,568,410 | 2/1986 | Thornquist | 156/643 |
| 4,793,897 | * 12/1988 | Dunfield et al. | 438/724 |
| 5,296,095 | * 3/1994 | Nabeshima et al. | 438/706 |
| 5,338,399 | * 8/1994 | Yanagida et al. | 438/709 |
| 5,423,945 | 6/1995 | Marks et al. | 156/662.1 |
| 5,506,450 | * 4/1996 | Lee et al. | 438/927 |
| 5,904,780 | * 5/1999 | Tomoyasu | 438/689 |
| 6,025,255 | * 2/2000 | Chen et al. | 438/595 |

\* cited by examiner

*Primary Examiner*—Mary Wilczewski
(74) *Attorney, Agent, or Firm*—George O. Saile; Stephen B. Ackerman

(57) ABSTRACT

The practice of forming self-aligned contacts (SACs) in MOSFETs using a silicon nitride gate sidewall and a silicon nitride gate cap has found wide acceptance, particularly in the manufacture of DRAMs, where bitline contacts are formed between two adjacent wordlines, each having a nitride sidewall. The contact etch requires a an RIE etch having a high oxide/nitride selectivity. In order to etch SACs having widths of less than 0.35 microns at their base, such as are encountered in high density DRAMs, special steps must be taken to prevent polymer bridging across the opening which leaves residual insulative material at the base of the contact. The problem is further complicated when the insulative layer through which the opening is formed comprises a silicate glass such as BPSG over a silicon oxide layer. The invention discloses the use of an etchant gas mixture containing octafluorocyclobutane and $CH_3F$ in combination with a small but critical concentration of oxygen to etch the SAC opening cleanly and without deleterious erosion of silicon nitride sidewall insulation. The added oxygen prevents polymer bridging across the narrow portion of the SAC.

16 Claims, 7 Drawing Sheets

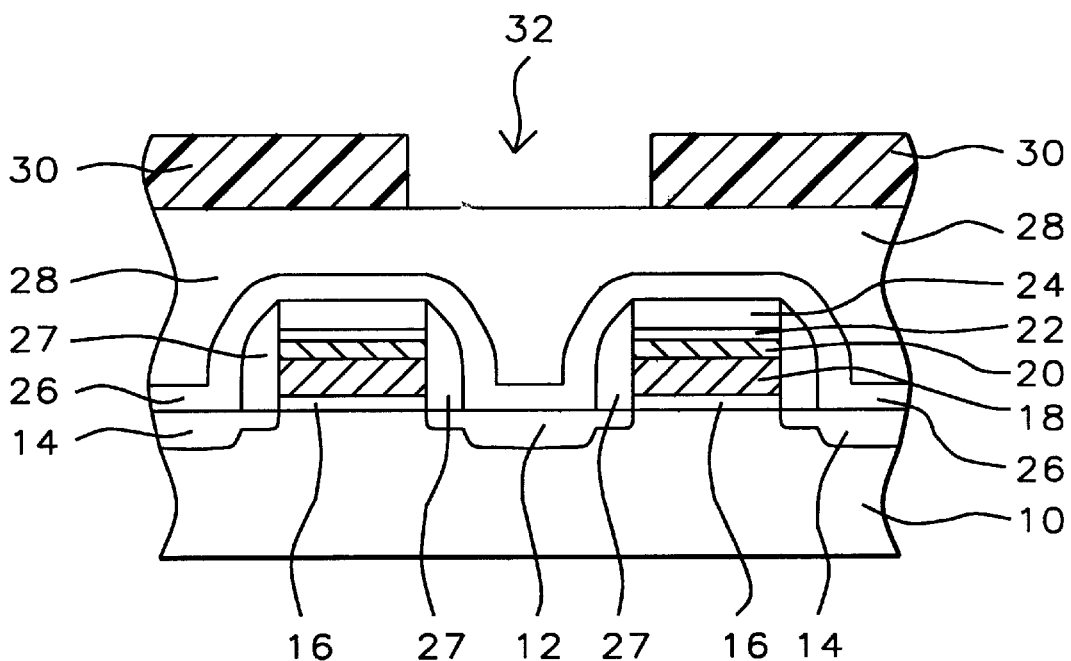
FIG. 1 – Prior Art
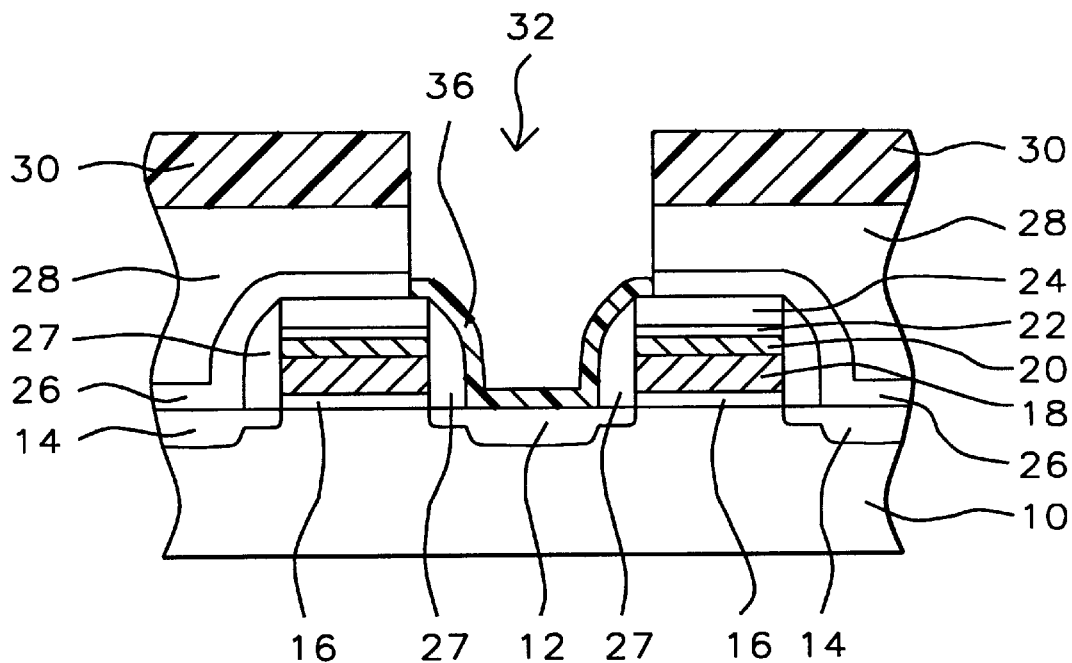
FIG. 2 – Prior Art

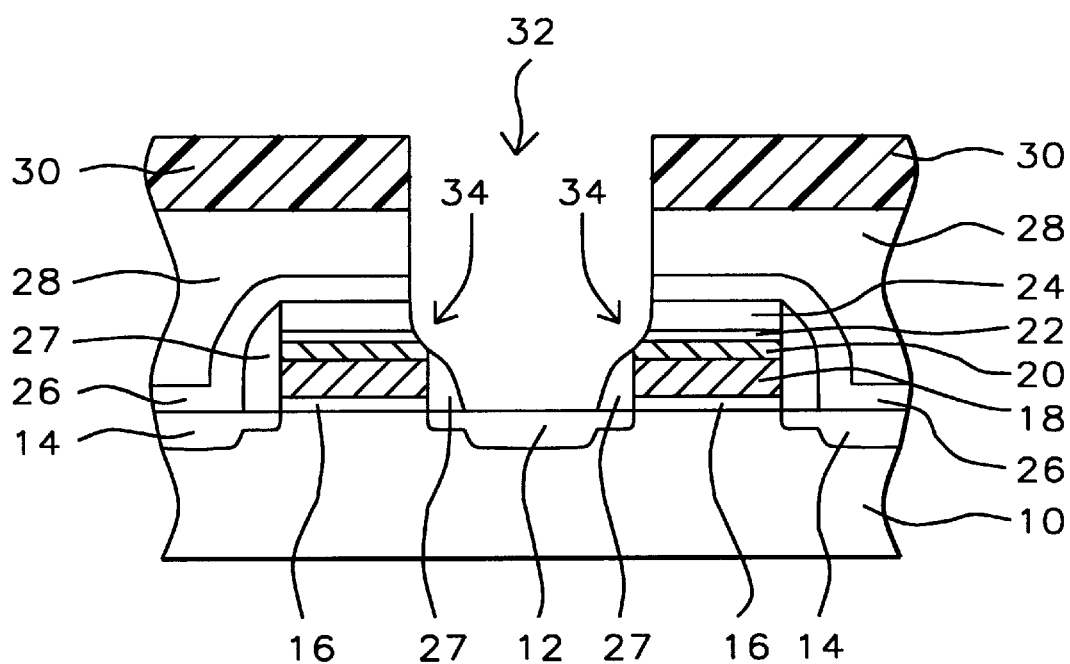
FIG. 3 – Prior Art

METHOD OF SELF-ALIGNED CONTACT HOLE ETCHING BY FLUORINE-CONTAINING DISCHARGES

RELATED PATENT APPLICATION

Application Ser. No. 09/105,106, filed on Jun. 25, 1998, now U.S. Pat. No. 6,025,255, "A TWO-STEP ETCHING PROCESS FOR FORMING SELF-ALIGNED CONTACTS", B. L. Chen, E. S. Jeng, and H. T. Lee, assigned to a common assignee.

BACKGROUND OF THE INVENTION

(1) Field of the Invention

The invention relates to processes for the manufacture of semiconductor devices and more particularly to the etching of contact openings in the manufacture of sub-micron MOSFETs.

(2) Background of the Invention and Description of Prior Art

The fabrication of integrated circuit chips comprises the formation of semiconductor devices within the surface of a single crystalline silicon wafer. The semiconductive elements of metal-oxide-silicon-field-effect-transistors (MOSFETs) are contained within the surface of the single crystalline substrate wafer and are formed by ion-implantation using the control electrode, a polysilicon gate formed over the substrate, as an implantation mask. The source and drain regions of the MOSFET are thereby self-aligned to the gate electrode.

Many variations of the principle of self alignment to the polysilicon gate have been developed to improve device performance and stability, in particular, the use of side walls along the edges of the polysilicon gate have permitted the tailoring of source and drain diffusions at the ends of the channel region to control short channel effects. These advances in MOSFET processing have resulted in high performance sub-micron sized devices of many types. The lightly-doped-drain (LDD) structure, used universally in sub-micron MOSFET technology, is a notable example of this side-wall tailoring.

The use of insulative sidewalls and caps over polysilicon conductors has also permitted the formation of self-aligned contacts (SAC) to MOSFET active elements. Self-alignment processing utilizes reactive-ion-etching (RIE) to anisotropically etch vertical walled openings, typically through insulative layers, such as silicon oxide and various silicate glasses.

Self-aligned-contacts can be made in various configurations. Typically an insulative sidewall is provided along the edge of the polysilicon gate electrode. The sidewall provides an insulative spacing between the contact and the polysilicon gate. Referring to FIG. 1 there is shown a cross section of a silicon wafer with two adjacent MOSFETs. The configuration shown here is typical of a well known design (DASH Cell) for a dynamic random access memory (DRAM) cell. The polysilicon gate electrodes 18 form the wordlines of the DRAM. The source/drain diffusions 12, 14 are formed by the widely used LDD process utilizing the sidewalls 27. In subsequent processing steps, storage capacitors are formed over the semiconductive elements 14 while a bitline contact is made to the semiconductive element 12.

The polysilicon wordlines in this example have a tungsten silicide layer 20 and a thin silicon oxide layer 22 over them. The sidewalls 27 and a top protective layer 24 are formed of silicon nitride. These layers are formed and patterned by conventional modern processing techniques well known to those in the art. An insulative layer 26 of silicon oxide is deposited over the wafer 10 followed by a silicate glass layer 28, for example, phosphosilicate glass PSG or borophosphosilicate glass(BPSG). This layer 28 is planarized by any of several well known techniques, for example chemical mechanical polishing (CMP). An opening for the bitline contact is then defined using well known photolithographic processing methods, whereby a pattern is formed in a photoresist layer 30. The photomask opening 32 can be made larger than the contact area at the silicon surface. The self-alignment feature also permits slight mis-alignment of the photomask because the contact at the silicon is determined by the nitride sidewall 27.

The wafer 10 is next subjected to an RIE processing step whereby the opening 32 for the bitline contact is etched through the insulative layers 26, 28. The etchant gas and the RIE parameters are selected to provide vertical walls in the opening in the silicon oxide layer and a high silicon oxide etch rate selectivity, that is to say, a high silicon oxide/silicon nitride etch rate ratio. The opening 32 illustrated in FIG. 2 was formed with an etch rate sensitivity sufficiently high that the nitride sidewalls 27 and the exposed upper portions of the nitride top cap 24 were imperceptibly etched. The layer 36 is a polymer which is formed during the etching process. Under conditions of inadequate etch rate selectivities the nitride sidewalls 27 and top nitride cap 24 etch at rates whereby the insulative spacing provided by these elements is reduced by erosion of the nitride, resulting in subsequent shorts between bitline and wordline. This is illustrated in FIG. 3 Where the upper corners 34 of the wordlines have been exposed.

Until recently, etch rate selectivities greater than about 8:1 were not attainable without sacrificing other important aspects such as etching anisotropy. In the current technology, where dimensional features are of the order of quarter micron, it becomes increasingly more difficult to achieve a sufficiently high etch rate selectivity for this contact opening etch without aggravating deleterious side effects, for example incomplete oxide removal at the base of the contact resulting in unacceptable contact resistance.

Marks, et.al., U.S. Pat. No. 5,423,945 discloses reducing the fluorine content of the passivation polymer, and reducing the amount of free fluorine in the plasma, reduces the dissociation of the polymer. By adding a fluorine scavenger such as silicon or carbon ions to the plasma, the resultant polymer becomes carbon rich and is more resistant to dissociation. In an example, an etch rate selectivity of oxide to nitride of 15:1 was achieved by the use of a fluorine scavenger.

Yanagida, et.al., U.S. Pat. No. 5,338,399 obtain high etch rate selectivities of insulators with respect to silicon base material, while also achieving low pollution, and low silicon damage, by using cyclic fluorocarbons, for example octafluorocyclobutane ($C_4F_8$) to etch contact openings. The cyclic fluorocarbons provide a higher C/F ratio than comparable straight chain fluorocarbons which is considered beneficial for effectively depositing carbonaceous polymers.

It is widely believed that polymer formation in an RIE plasma containing fluorocarbon etchants, is largely responsible, not only for the etching anisotropy, but also for the etch rate selectivity. In the case of silicon oxide etching, the polymer formed at the etching front is rapidly dissociated by the released oxygen. However, over regions of silicon nitride, the oxygen concentration is less and the polymer is not readily dissociated, thereby providing passivation of the silicon nitride.

In order to achieve the high etch rate sensitivity to achieve the profile shown in FIG. 2, it was necessary to utilize etchant gases and RIE parameters which provided a relatively high steady state polymer thickness over the $Si_3N_4$. The residual polymer 36 is shown prior to its removal at the termination of the etching operation. An insufficient steady state polymer thickness leads to the profile shown in FIG. 3. where the $Si_3N_4$ has been eroded.

As device densities are increased and their geometries become smaller, new problems arise in the etching of openings for self-aligned contacts. In particular, as the dimensions of the contact openings enter the sub-quarter micron range, difficulties are encountered with clearing of insulative material from the base of the opening when etching at high $SiO_2/Si_3N_4$ selectivities. Heavy polymer formation over the silicon nitride spacers interferes with the proper clearance of insulative material at the base of the opening by bridging across the narrow opening, thereby terminating the etching. Residual oxide in the opening causes opens or unacceptably high contact resistance.

FIG. 4A illustrates a cross section of a bitline contact opening 40 defined by a photoresist masking layer 30. The layout is similar to that shown in FIG. 1 except that now the spacing between the polysilicon wordlines is reduced. The width d, of the photoresist opening 40 which defines the upper part of the SAC is between about 0.25 and 0.3 $\mu$m. However, the distance $d_2$ between the silicon nitride spacers 27 at the base of the SAC opening is about 0.15 $\mu$m or less.

FIG. 4B shows the contact cross section at an instant during the etching when the etch front has traveled through the upper portion of the silicate glass layer 28 and has just penetrated the silicon oxide layer 26. When the etch front penetrates the silicon oxide layer 26 as shown in FIG. 4B, the rate of polymer formation on the exposed oxide layer 26 is different than that over the central remaining portion 28A of the silicate glass layer 28 causing a topographic irregularity at the $SiO_2$/Glass interface. The silicate glass 28A etches at rate about 10% slower than the $SiO_2$ layer 16. Then, referring to FIG. 4C, as the etch front proceeds further to expose the $Si_3N_4$ caps 24 and the $Si_3N_4$ sidewall structures 27, a polymer layer 36 forms over the $Si_3N_4$ structures.

Eventually, as the opening narrows between the $Si_3N_4$ sidewalls 27, the thick polymer over the $Si_3N_4$ bridges the opening and pinches off access of the reactant gases to the underlying oxide /silicate glass 38, resulting in incomplete clearance at the SAC base. This is shown in the cross section in FIG. 4D. The residual material 38 in the opening may cause an open or unacceptable and erratic high resistance contacts.

Dunfield, U.S. Pat. No. 4,793,897 shows a plasma process using a fluorinated etching gas mixture with oxygen to selectively etch silicon nitride with high selectivity for an underlying silicon oxide layer. The mixture contains $NF_3$, $SiF_4$ and $O_2$. The $NF_3$ is the main nitride etchant while the $O_2$ combines with silicon from the $SiF_4$ to selectively form a silicon oxide containing deposit on the oxide underlayer and thus increase the selectivity for oxide layers. Thornquist, U.S. Pat. No. 4,568,410 also shows a method for etching $Si_3N_4$ in the presence of $SiO_2$ using a gas including $NF_3$.

SUMMARY OF THE INVENTION

It is an object of this invention to provide an improved method for forming self aligned contact openings in integrated circuits.

It is another object of this invention to provide an process for reactive ion etching of self-aligned contact openings, having $Si_3N_4$ sidewalls wherein the widths of said openings at their base is less than 0.15 $\mu$m.

It is another object of this invention to provide an process for reactive ion etching of self-aligned bitline contact openings between adjacent wordlines in DRAM integrated circuits wherein said wordlines, have $Si_3N_4$ caps and $Si_3N_4$ sidewalls and wherein the widths of said openings at their base are less than 0.15 $\mu$m.

It is yet another object of this invention to provide a process for reactive ion etching of self-aligned contacts adjacent to gate stacks with reduced gate-to-contact shorts.

These objects are accomplished by a utilizing an etchant mixture comprising $C_4F_8$, $CH_3F$, and $O_2$ in an argon carrier gas. The addition $O_2$ in small amounts to the fluorocarbon mixture reduces the encroachment of polymer into the narrower opening thereby preventing pinch-off. Small amounts of $O_2$ are also found to improve the ability to etch stop on the $Si_3N_4$ interfaces thereby reducing the risk of gate-to-bitline contact shorts. The flow rate of $O_2$ iS restricted to a narrow range which is critical to the process.

BRIEF DESCRIPTION OF THE DRAWINGS

FIG. 1 is a cross sectional view showing a portion of a DRAM cell wherein a photoresist mask defines a self-aligned bitline contact opening over an area of an insulative layer which is located between two adjacent wordlines.

FIG. 2 is a cross sectional view showing a portion of a DRAM cell wherein a self-aligned bitline contact opening is has been etched between two adjacent wordlines into an insulative layer by RIE using an etch with high oxide/nitride selectivity.

FIG. 3 is a cross sectional view showing a portion of a DRAM cell wherein a self-aligned bitline contact opening has been etched between two adjacent wordlines into an insulative layer by RIE using an etch having a low oxide/nitride selectivity.

DESCRIPTION OF THE PREFERRED EMBODIMENTS

Figure 4A:
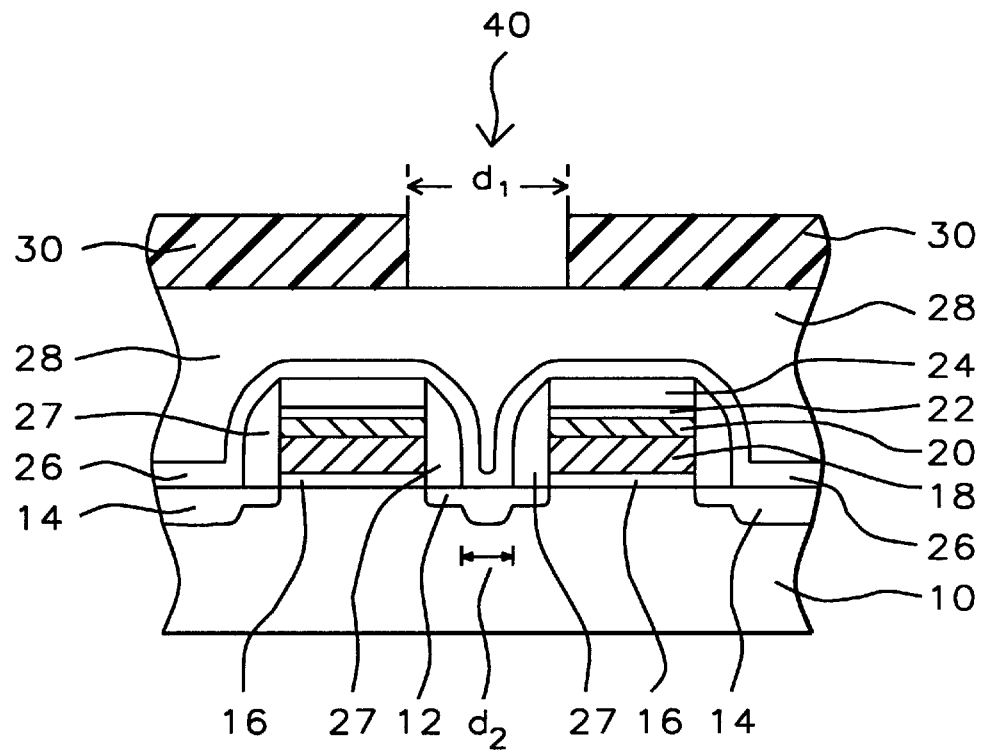
FIG. 4A through FIG. 4D are cross sections showing the progression of the etching of a sub-quarter micron self-aligned bitline contact opening in an insulative layer, between two adjacent wordlines of a DRAM cell by RIE using an etch having a high oxide/nitride selectivity.
Figure 4B:
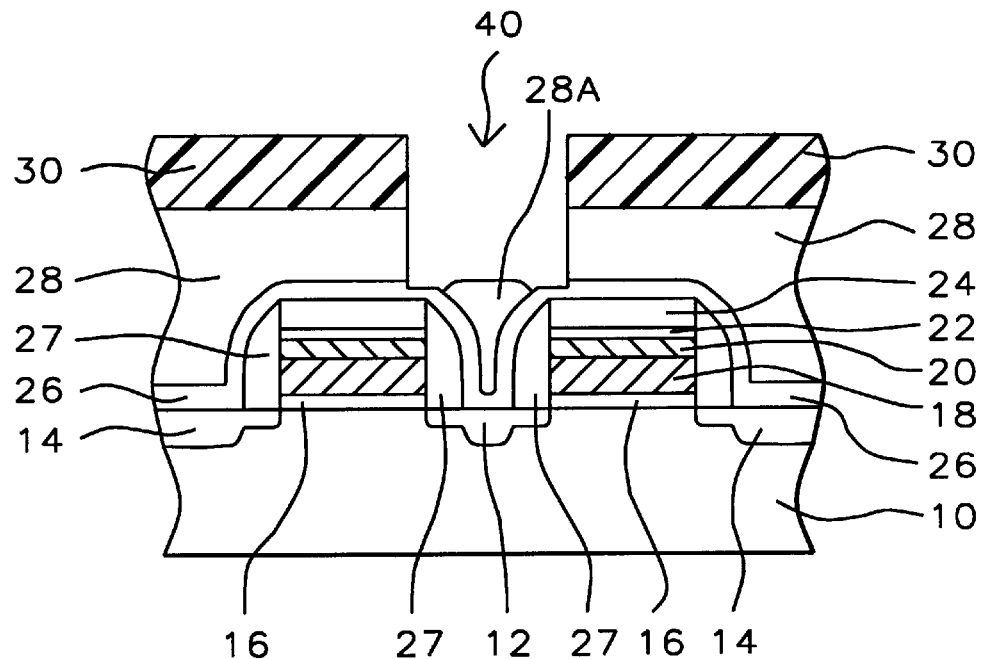
Figure 4C:
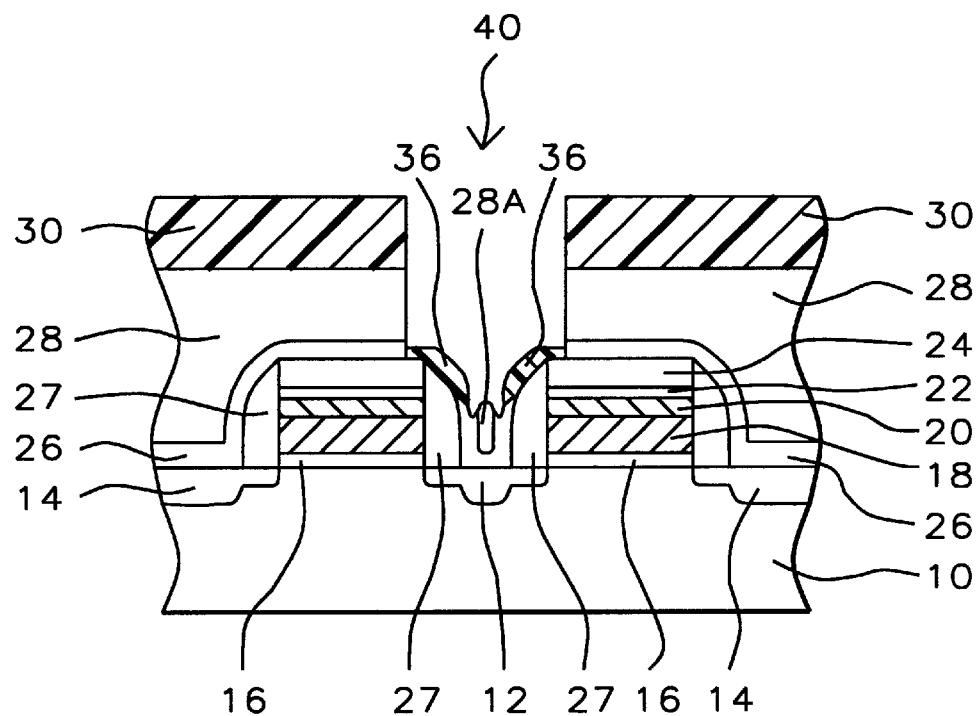
Figure 4D:
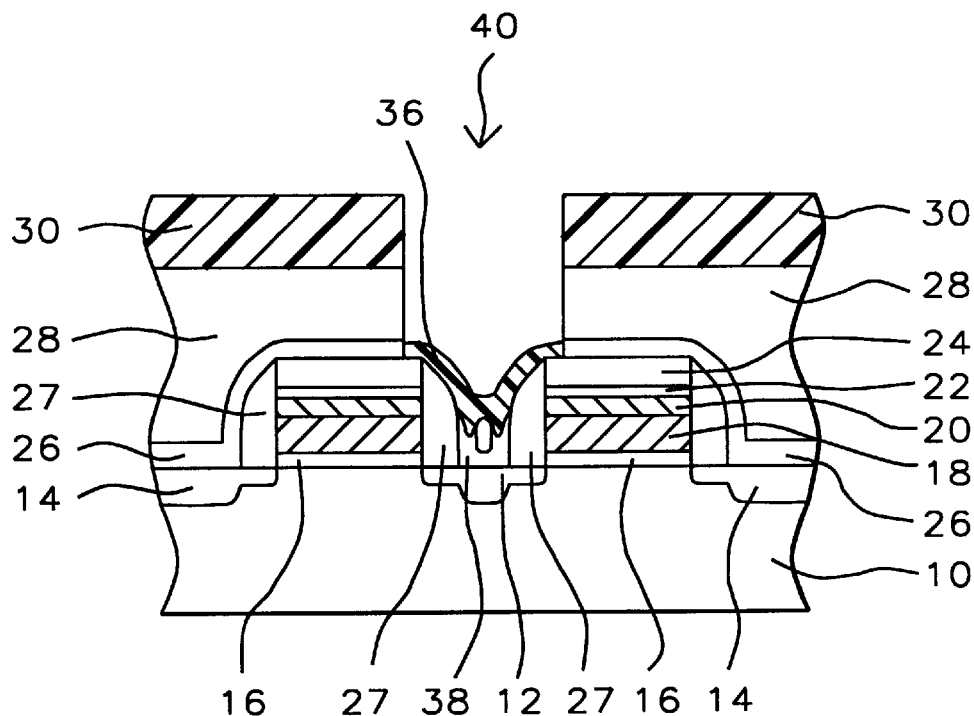
Figure 5A:
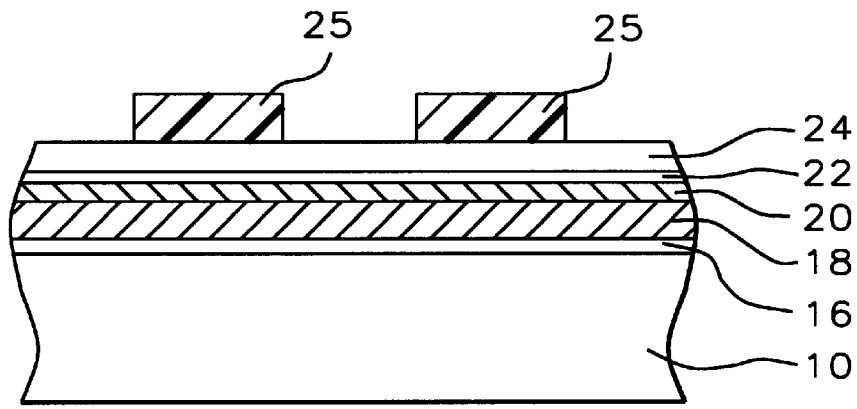
FIG. 5A through FIG. 5F are cross sectional views of a portion of a DRAM cell illustrating a progression of processing steps for forming a sub-quarter micron self-aligned bitline contact opening in an insulative layer, between two adjacent wordlines according to a preferred embodiment of the current invention

In a preferred embodiment of this invention a DRAM cell structure is formed having a self-aligned bitline contact formed between two adjacent wordlines. The width of the contact opening at it's base is less than about 150 nm. and the spacing between adjacent wordlines is 300 nm. or thereabout. Referring to FIG. 5A an silicon wafer 10 having a doped polysilicon 18 over a gate oxide 16 is provided. The doped polysilicon layer 18 may be of composite form, and may have an additional conductive layer 20 of a suicide, for example $WSi_x$ over it. The polysilicon layer 18 is deposited by well known chemical vapor deposition(CVD) methods and is made conductive by doping with an impurity during deposition or subsequently by ion implantation. The polysilicon layer 18 is between about 50 and 150 nm thick. A layer of silicon oxide 22 is deposited, by a CVD method such as the thermal decomposition of tetraethoxyorthosilicate (TEOS) The silicon oxide layer 22 is between about 20 and 50 nm thick. A cap layer 24 of silicon nitride is next deposited over the silicon oxide layer 22. This layer 24 is between about 150 and 250 nm thick, and is deposited by CVD using well known precursors such as silane and ammonia.

Wordlines which form the gate electrodes of the MOSFETs are next patterned in a photoresist layer 25 using well known state of the art photolithographic techniques and the MOSFET gate stack is anisotropically etched by RIE. The spacing between wordlines in current sub-micron DRAM designs is typically between about 0.2 and 0.3 microns.

Figure 5B:
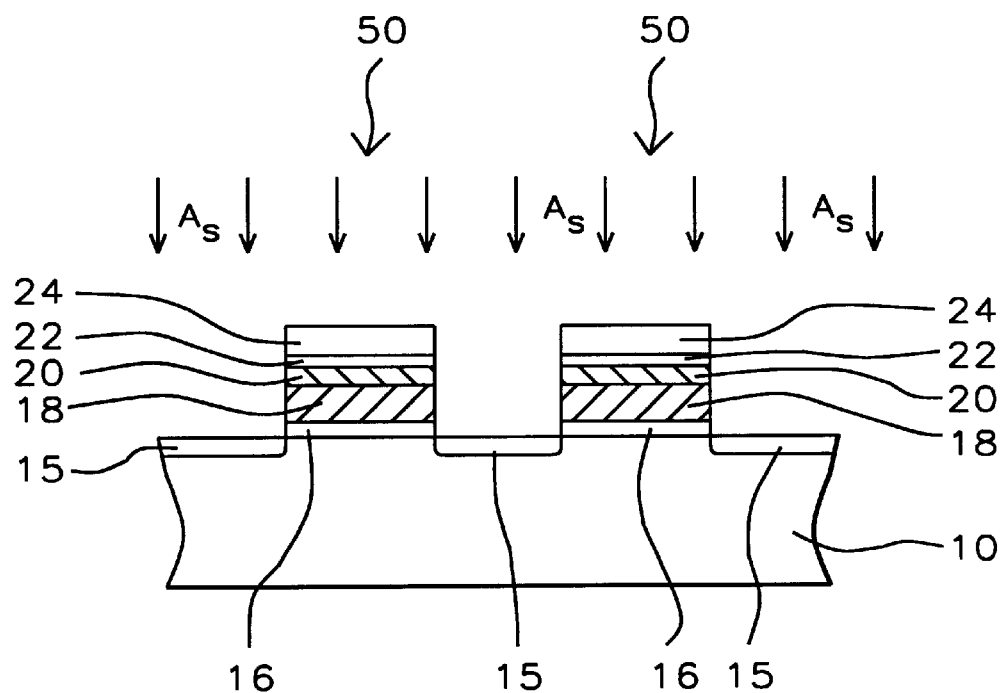

Referring next to FIG. 5B, there is shown a cross section of the DRAM cell portion after the wordines 50 have been formed by the RIE and the residual photoresist has been removed, either by ashing or by conventional photoresist strippers. An ion implant is next performed using arsenic ions at a dose of between about $10^{12}$ and $10^{14}$ atoms/cm$^2$ and an energy of between about 20 and 40 keV thereby forming the lightly doped drains 15.

Figure 5C:
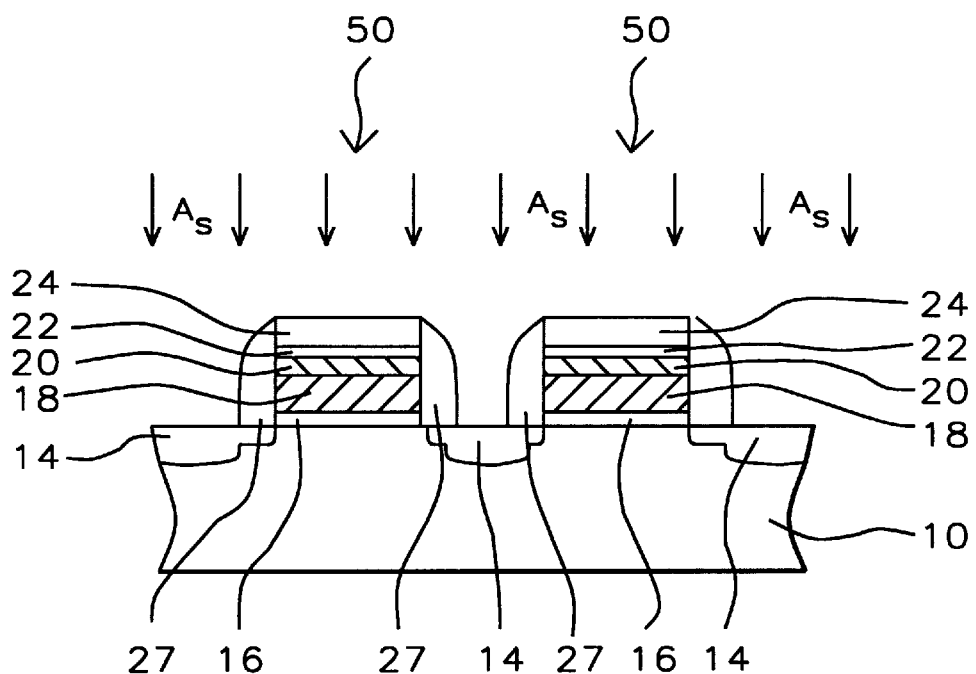

Referring now to FIG. 5C, silicon nitride sidewalls 27 are formed adjacent to the wordline structures 50 by a well known method whereby a conformal layer of silicon nitride is deposited by CVD to a thickness corresponding to the desired sidewall thickness. In order to reduce interfacial stress, a thin pad oxide layer (not shown) may be deposited prior to the deposition of the nitride layer. This layer is then etched back anisotropically by RIE, leaving the sidewalls 27 adjacent to the wordline structures 50. The sidewalls function, not only to define the lightly-doped-drain (LDD) structure, but they also space the self-aligned contact away from the polysilicon gate and the LDD region. In the current DRAM design the thickness of the silicon nitride sidewalls 27 are between about 50 and 100 nm. at their base.

After the sidewalls 27 are in place, the wafer 10 is implanted with arsenic at a dose of between about $10^{14}$ and $10^{16}$ atoms/cm$^2$ and an energy of between about 20 and 40 keV. This deeper and heavier implant forms the source and drain regions 12, 14 of the now completed MOSFETs whose gates comprise the wordlines 50.

Figure 5D:
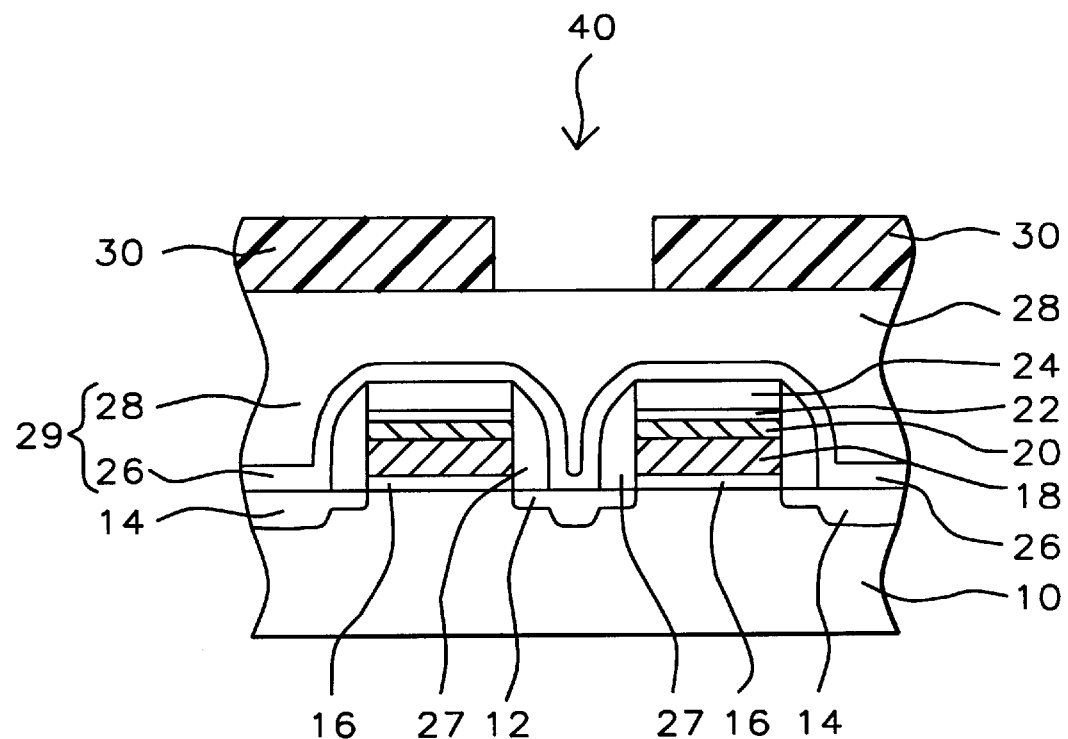

Referring next to FIG. 5D, an insulative layer 29 is deposited over the wafer 10. The layer 29 as illustrated in this embodiment is composite, having a lower portion 26 of low pressure CVD (LPCVD) silicon oxide and an upper portion 28 of a phosphosilicate glass or a borophosphosilicate glass deposited by LPCVD. Alternatively the layer 29 may consist entirely of silicon oxide. The insulative layer 29 is deposited to a total thickness of between about 800 and 1,000 nm. CVD methods for deposition of insulative films by CVD are widely practiced and are well known in the art.

After deposition the layer 28 is planarized to remove topological features which are replicated on its surface after deposition. This is accomplished, preferably by CMP. Thermal flowing of the silicate glass may also be used to planarize the insulative layer 28. A photoresist layer 30 is next deposited and patterned using well known, state of the art photolithography, to define a bitline contact opening 40. The wafer is then placed into the chamber of a HDP (high density plasma) etching tool. An appropriate commercially available HDP etcher is manufactured by Applied Materials, Inc. of Santa Clara CA.

After an initial pumpdown to about $10^{-6}$ Torr or below the first etching step is begun. An etchant gas mixture containing octafluorocyclobutane ($C_4F_8$) at between about 10 and 15 SCCM (standard cubic centimeters per minute), $CH_3F$ at between about 5 and 15 SCCM and $O_2$ at between 1 and 3 SCCM is admitted in an argon carrier gas at between about 50 and 100 SCCM to maintain a total chamber of between about 2 and 10 milliTorr. An rf plasma is struck at power of 1,500 Watts or thereabout and the upper 28 and lower 26 portions of the composite insulative layer 29 are etched to form a the contact opengin 40. This corresponds to a power density of about 4.6 Watts/cm$^2$. Under these conditions vertical sidewalls are achieved and the oxide/nitride etch rates are in a ratio of about 20:1.

When $C_4F_8$ and $CH_3F$ are used under these conditions in the absence of $O_2$, an oxide/nitride selectivity of about 30:1 is realized. However, because of the small dimensions of the contact opening, residual insulative material remains within the opening. In order to clear the opening entirely, at least 1 SCCM $O_2$ must be included in the etchant gas. This provides sufficient dissociation of surface polymer to maintain etching of the insulative layer to clear the base of the contact opening. On the other hand, if $O_2$ flow rates exceed 3 SCCM, under the aforementioned conditions, an insufficient steady state amount of polymer is maintained and harmful erosion of the $Si_3N_4$ cap/sidewall structure 24/27 occurs. It has been found that the flow rate of $O_2$ is critical and care must taken in order to stay within the recommended range in order to achieve the desired result.

Figure 5E:
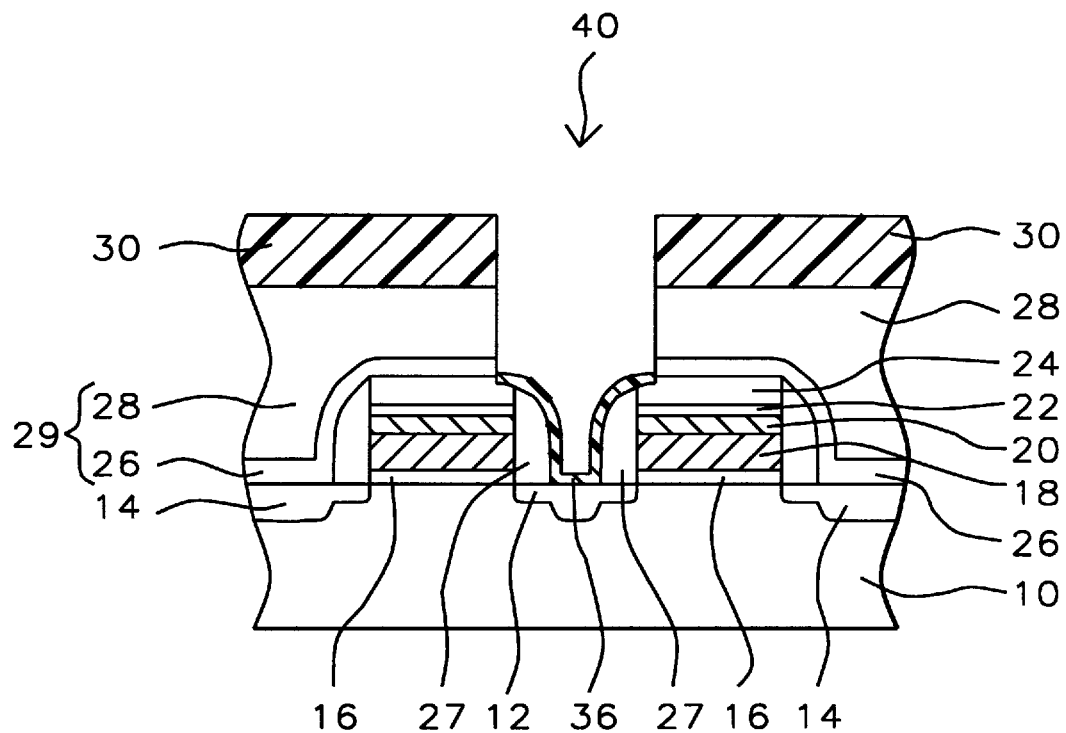
Figure 5F:
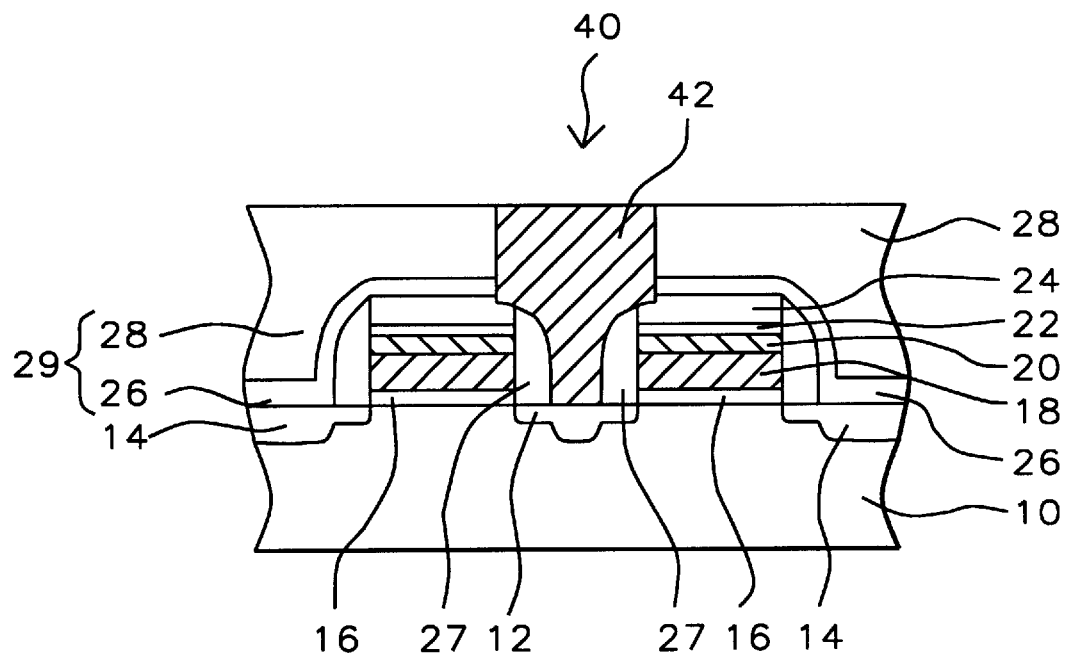

FIG. 5E is a cross section showing the contact profile upon completion of the RIE etch step. Residual polymer 36 and the residual photoresist 30 are next removed using well known stripping methods, for example, ashing. Referring now to FIG. 5F, a contact metallurgy 42, for example a tungsten, is next deposited into the SAC opening 40 using procedures well known by those in the art. Additional processing steps for forming a DRAM cell include the formation of bitlines over the insulator 28 and contacting the metallurgy 42 and of storage capacitors (not shown) which are formed contacting the silicon active areas 14. These processing steps are many and varied and are well known and understood by those in the art.

While the invention has been particularly shown and described with reference to the preferred embodiments thereof, it will be understood by those skilled in the art that various changes in form and details may be made without departing from the spirit and scope of the invention.

What is claimed is:

1. A method for forming a self-aligned contact to a semiconductor element adjacent to a gate electrode of a MOSFET comprising:

(a) providing a silicon wafer having a vertical walled gate stack with a silicon nitride insulative cap, a silicon nitride sidewall, and an active semiconductor element within the surface of said silicon wafer adjacent to said sidewall;

(b) depositing a first insulative layer over said silicon wafer;

(c) depositing a second insulative layer on said first insulative layer;

(d) planarizing said second insulative layer;

(e) depositing a photoresist layer over said second insulative layer;

(f) patterning said photoresist layer to define a contact opening which extends over said sidewall and partially over said cap;

(g) etching said second insulative layer and said first insulative layer in an RIE etching tool in an rf plasma containing an etchant mixture of octafluorocyclobutane and CH₃F, in an argon carrier gas, at a flow rate to maintain a chamber pressure of between about 2 and 10 millitorr, while adding a flow of O₂ to said etchant mixture to maintain and control a sufficient steady state thickness of a polymer, which forms on surfaces of said cap and said sidewall exposed by said etching, to achieve a silicon oxide/silicon nitride etch rate ratio of about 20:1, while not obstructing said etching by polymer bridging, thereby forming a contact opening which is self-aligned to said sidewall;

(h) removing residual said polymer and said photoresist layer; and (i) depositing a conductive material into said contact opening, thereby forming a self-aligned contact.

2. The method of claim 1 wherein said first insulative layer is silicon oxide.

3. The method of claim 1 wherein said second insulative layer is selected from the group consisting of silicon oxide, a phosphosilicate glass and a borophosphosilicate glass.

4. The method of claim 1 wherein the width of said contact opening at its base is between about 0.1 and 0.4 microns.

5. The method of claim 1 wherein the height of said vertical walled gate stack is between about 230 and 500 nm.

6. The method of claim 1 wherein the thickness of said sidewall structure is between about 50 and 100 nm.

7. The method of claim 1 wherein the total thickness of said first insulative layer and said second insulative layer above said vertical walled stack is between about 800 and 1,000 nm.

8. The method of claim 1 wherein said planarizing is CMP.

9. The method of claim 1 wherein said octafluorocyclobutane is flowed at a rate of between about 10 and 15 SCCM, said CH₃F is flowed at a rate of between about 5 and 15 SCCM, and said O₂ is flowed at a rate of between about 1 and 3 SCCM.

10. A method for forming a DRAM cell structure having a self-aligned bitline contact to a semiconductive element between two adjacent wordlines comprising:

(a) providing a silicon wafer having a gate oxide layer subjacent to a conductive layer;

(b) depositing a silicon oxide layer over said conductive layer;

(c) depositing a first silicon nitride layer, over said silicon oxide layer;

(d) depositing and patterning a first photoresist layer to define two adjacent wordlines;

(e) anisotropically etching said first silicon nitride layer, said silicon oxide layer, and said conductive layer thereby forming said wordlines;

(f) implanting a first dose of impurity atoms;

(g) removing said first photoresist layer;

(h) depositing a second silicon nitride layer;

(i) anisotropically etching said second silicon nitride layer thereby forming sidewalls along the edges of said wordlines;

(j) implanting a second dose of impurity atoms thereby forming a semiconductive element;

(k) depositing an insulative layer over said silicon wafer;

(l) planarizing said insulative layer;

(m) depositing a second photoresist layer over said insulative layer;

(n) patterning said second photoresist layer to define a bitline contact opening between said two adjacent wordlines whereby said bitline contact opening is to be self-aligned to said sidewalls;

(o) etching said insulative layer in an RIE etching tool utilizing an rf plasma containing a mixture of octafluorocyclobutane and CH₃F in an argon carrier gas, at a flow rate to maintain a chamber pressure of between about 2 and 10 millitorr, while adding a flow of O₂ to said etchant mixture to maintain and control a sufficient steady state thickness of a polymer, which forms on surfaces of said cap and said sidewall exposed by said etching, to achieve a silicon oxide/silicon nitride etch rate ratio of about 20:1, without obstructing said etching by polymer bridging, thereby forming a bitline contact opening which is self-aligned to said sidewalls;

(p) removing residual said polymer and said second photoresist layer;

(q) depositing a conductive element into said contact opening, thereby forming a self-aligned bitline contact;

(r) forming a bitline over said bitline contact; and (s) forming storage capacitors on said silicon wafer.

11. The method of claim 10 wherein said first insulative layer is silicon oxide.

12. The method of claim 10 wherein said second insulative layer is selected from the group consisting of silicon oxide, a phosphosilicate glass and a borophosphosilicate glass.

13. The method of claim 10 wherein the width of said bitline contact opening at its base is between about 0.1 and 0.4 microns.

14. The method of claim 10 wherein the thickness of said sidewalls is between about 50 and 100 nm.

15. The method of claim 10 wherein the distance between said two adjacent wordlines is between about 0.18 and 0.35 microns.

16. The method of claim 10 wherein said octafluorocyclobutane is flowed at a rate of between about 10 and 15 SCCM, said CH₃F is flowed at a rate of between about 5 and 15 SCCM, and said O₂ is flowed at a rate of between about 1 and 3 SCCM.

* * * * *